(12) United States Patent
Lee

(10) Patent No.: US 11,552,194 B2
(45) Date of Patent: *Jan. 10, 2023

(54) LOW LOSS POWER DEVICE AND METHOD FOR FABRICATING THEREOF

(71) Applicant: metaMOS Solutions Inc., Taipei (TW)

(72) Inventor: Timothy Lee, Taipei (TW)

(73) Assignee: metaMos Solutions Inc., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/179,863

(22) Filed: Feb. 19, 2021

(65) Prior Publication Data
US 2021/0376146 A1    Dec. 2, 2021

Related U.S. Application Data

(60) Provisional application No. 63/032,159, filed on May 29, 2020.

(51) Int. Cl.
*H01L 29/68*    (2006.01)
*H01L 29/78*    (2006.01)
(Continued)

(52) U.S. Cl.
CPC .... *H01L 29/7831* (2013.01); *H01L 29/42368* (2013.01); *H01L 29/66484* (2013.01)

(58) Field of Classification Search
CPC ......... H01L 29/42368; H01L 29/66484; H01L 29/402; H01L 29/665; H01L 29/66689;
(Continued)

(56) References Cited

U.S. PATENT DOCUMENTS

| | | | |
|---|---|---|---|
| 5,548,150 A | 8/1996 | Omura et al. | |
| 6,121,666 A | * 9/2000 | Burr | ..................... H01L 29/7835 257/E29.054 |

(Continued)

OTHER PUBLICATIONS

Search Report for Application No. 21169532.5-1212 dated Oct. 15, 2021.

(Continued)

*Primary Examiner* — Shahed Ahmed
(74) *Attorney, Agent, or Firm* — Demian K. Jackson; Jackson IPG PLLC

(57) ABSTRACT

Existing semiconductor transistor processes may be leveraged to form lateral extensions adjacent to a conventional gate structure. The dielectric thickness under these lateral gate extensions can be varied to optimize device channel resistance and enable resistance to breakdown at high operating voltages. These extensions may be patterned with dimensions that are not limited by lithographic resolution and overlay capabilities and are compatible with conventional processing for ease of integration with other devices. The lateral extensions and dielectric spacers may be used to form self-aligned source, drain, and channel regions. A thin dielectric layer may be formed under an extension gate to reduce channel resistance. A thick dielectric layer may be formed under an extension gate to improve operation voltage range. The present invention provides an innovative structure with lateral gate extensions which may be referred to as EGMOS (extended gate metal oxide semiconductor).

6 Claims, 12 Drawing Sheets

(51) Int. Cl.
*H01L 29/423* (2006.01)
*H01L 29/66* (2006.01)

(58) Field of Classification Search
CPC ............. H01L 29/7816; H01L 29/7824; H01L 29/42356; H01L 29/66681; H01L 29/7831–7832; H01L 21/823437–823456; H01L 21/28158–28238; H01L 29/66833–6684
See application file for complete search history.

(56) References Cited

U.S. PATENT DOCUMENTS

| | | | |
|---|---|---|---|
| 6,710,416 B1 | 3/2004 | Xu | |
| 8,981,453 B2* | 3/2015 | Cha | H01L 29/42324 |
| | | | 257/300 |
| 2012/0161239 A1* | 6/2012 | Koyama | H01L 27/1225 |
| | | | 257/E27.06 |
| 2014/0239391 A1 | 8/2014 | Toh et al. | |
| 2014/0264574 A1 | 9/2014 | Loechelt | |
| 2016/0172490 A1* | 6/2016 | Lao | H01L 29/402 |
| | | | 257/408 |
| 2017/0092726 A1 | 3/2017 | Nidhi et al. | |
| 2017/0263763 A1* | 9/2017 | Ryu | H01L 29/0653 |
| 2018/0026134 A1 | 1/2018 | Eikyu et al. | |

OTHER PUBLICATIONS

Search Report dated Apr. 24, 2022 for counterpart application No. 11011320.

* cited by examiner

LOW LOSS POWER DEVICE AND METHOD FOR FABRICATING THEREOF

The present application for patent claims priority to pending provisional application No. 63/032,159, titled "Integrated Silicon-on-Insulator (SOI) Devices Suitable for Radio Frequency (RF) Applications," filed on May 29, 2020, and assigned to the assignee hereof and hereby expressly incorporated by reference herein as if fully set forth below and for all applicable purposes.

FIELD OF THE INVENTION

The present invention relates to a semiconductor device. More particularly, the present invention relates to a low loss power device and a method for fabricating thereof.

BACKGROUND OF THE INVENTION

Transistors are frequently used as elements in switches and amplifiers. Silicon-based metal-oxide-semiconductor field effect transistor (MOSFET) technology has been refined for decades to improve high-frequency performance and reduce costs. Silicon MOSFETs are particularly attractive for their relative ease of fabrication and large-scale integration facilitated by the high demand for microprocessors, as well as their power-efficiency compared to older bipolar transistor devices. Variations on conventional low-power MOSFETs used in microprocessors have been developed for use in high-power and high-frequency applications. Improved doping profiles and device geometries may be used to allow for operation at voltages of tens of volts or more. Modified material systems such as silicon-on-insulator technology and III-V semiconductor technology may be used to achieve higher power operation and higher maximum operating frequencies through improved carrier mobility.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

The following presents a simplified summary of one or more aspects of the present disclosure, in order to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present some concepts of one or more aspects of the disclosure in a simplified form as a prelude to the more detailed description that is presented later.

Existing semiconductor transistor processes may be leveraged to form lateral extensions adjacent to a conventional gate structure. The dielectric thickness under these lateral gate extensions can be varied to tune device performance and enable higher cut-off frequencies without compromising resistance to breakdown at high operating voltages. These extensions may be patterned with dimensions that are not limited by lithographic resolution and overlay capabilities and are compatible with conventional processing for ease of integration with other devices. The lateral extensions and dielectric spacers may be used to form self-aligned source, drain, and channel regions. A narrow-highly-doped channel may be formed under a narrow gate extension to improve operating frequencies without significantly increasing gate capacitance In one aspect, the present invention provides a low loss power device including: a substrate, having a semiconductive region extending below a top surface of the substrate, the semiconductive region having first and second ends opposing one another along a direction parallel to the top surface of the substrate; a first dielectric layer, formed above the semiconductive region of the substrate, having a first thickness; a first gate electrode, disposed on the first dielectric layer over the semiconductive region between the first and second ends; a second dielectric layer, having a second thickness, formed on the top surface of the substrate adjacent to the first dielectric layer below the first gate electrode and near the first end, wherein the second dielectric layer is formed separately after the first dielectric layer is formed; and a second gate electrode, disposed over the second dielectric layer and in electrical contact with the first gate electrode, wherein a sidewall of the second gate electrode opposite the first gate electrode is substantially perpendicular to a top surface of the substrate.

Preferably, the second thickness is not equal to the first thickness.

Preferably, the second thickness is less than the first thickness.

Preferably, the low loss power device further includes a first spacer, formed above the semiconductive region of the substrate and adjacent to the second gate electrode.

Preferably, the low loss power device further includes an electrically-conductive layer formed on the first dielectric layer and the second dielectric layer.

Preferably, the low loss power device further includes a third gate electrode adjacent to the first gate electrode disposed over the semiconductive region near the second end and separated from the semiconductive region by a third dielectric layer, wherein the third dielectric layer has a third thickness.

Preferably, the second thickness is less than the first thickness and the third thickness; and the first thickness is less than the third thickness.

Preferably, a sidewall of the third gate electrode opposite the first gate electrode is substantially perpendicular to a top surface of the substrate.

Preferably, the low loss power device further includes a second spacer, formed above the semiconductive region of the substrate and adjacent to the third gate electrode.

Preferably, a doped source well is formed within the semiconductive region at the first end; a doped drain well is formed within the semiconductive region at the second end; and a doped channel is in contact with the doped source well at an end of the doped source well distal from the first end of the semiconductive region, the doped channel well is disposed beneath the second gate electrode and separated from the second gate electrode by the second dielectric layer, the doped channel well has a majority carrier type opposite a majority carrier type of the doped source well and the doped drain well.

Preferably, the low loss power device further includes a doped drift region extending within the semiconductive region between the doped channel well and the doped drain well, the doped drift region is disposed beneath the first gate electrode and separated from the first gate electrode by the first dielectric layer, the doped drift region has a majority carrier type opposite the majority carrier type of the doped channel and has a majority carrier density lower than majority carrier densities of the doped channel, the doped source well, and the doped drain well.

Preferably, the low loss power device further includes a graded doping profile between the doped channel and the doped drift region.

Preferably, the low loss power device further includes an electrically-conductive material formed on the first gate electrode and the second gate electrode to electrically couple the first gate electrode and the second gate electrode.

In another aspect, the present invention provides a method for fabricating the aforementioned low loss power device. The method includes the steps of: providing a substrate having a semiconductive region extending below a top surface of the substrate, the semiconductive region having first and second ends opposing one another along a direction parallel to the top surface of the substrate; forming a first dielectric layer above the semiconductive region; disposing a first gate electrode over the semiconductive region between the first and second ends; forming a second dielectric layer having a second thickness on a first region of the top surface of the substrate adjacent to the first dielectric layer below the first gate electrode and near the first end; and disposing a second gate electrode over the second dielectric layer.

Preferably, the method further includes after the first gate electrode is disposed and before the second dielectric layer is formed the steps of: forming a third dielectric layer over the first gate electrode and the first dielectric layer; and patterning the first and third dielectric layers to expose the first region of the top surface of the substrate.

Preferably, the method further includes a step of: applying a first dopant to form a first doped volume within a first volume of the substrate corresponding to the first region, the first doped volume having a width determined at least in part by a width of the first region.

Preferably, the method further includes the steps of: forming a first spacer adjacent to the second gate electrode; and applying a second dopant to form a second doped volume within the first doped volume of the substrate, the second doped volume having a width determined by at least a width of the first region, a position of the second gate electrode, and a width of the first spacer; wherein the second doped volume has a majority carrier type opposite to a majority carrier type of the first doped volume.

Preferably, the second gate electrode is formed by the steps of: forming an electrically-conductive layer above the first gate electrode and the first region; and patterning the electrically-conductive layer by an anisotropic reactive ion etching (RIE) process that leaves behind a portion of the electrically-conductive layer on the second dielectric layer to form the second gate electrode, the second gate electrode having vertical sidewalls that are substantially perpendicular to the top surface of the substrate.

Preferably, the electrically-conductive layer is patterned after forming above the first gate electrode and above the first region without forming any layer that acts as a mask defining dimensions of the second gate electrode; and a width of the second gate electrode is defined by an as-formed thickness of the electrically-conductive layer.

Preferably, patterning the electrically conductive layer comprises the steps of: forming a protective dielectric material layer above the electrically-conductive layer with a protective layer thickness; and etching the protective dielectric material layer using the anisotropic RIE process; wherein the anisotropic RIE process preferentially etches the protective dielectric layer and the electrically-conductive layer along a direction perpendicular to the top surface of the substrate; wherein the anisotropic RIE process removes the protective dielectric layer with a greater etching rate than an etching rate for the electrically-conductive layer; wherein the protective layer thickness and the anisotropic RIE process are jointly configured such that residual protective dielectric material adheres to a vertical sidewall of the second gate electrode farthest from the first gate electrode that faces the first gate electrode; and wherein the protective layer thickness and the anisotropic RIE process are jointly configured such that residual protective dielectric material adheres to a vertical sidewall of the third gate electrode farthest from the first gate electrode that faces the first gate electrode.

DETAILED DESCRIPTION OF THE PREFERRED EMBODIMENTS

Figure 1:
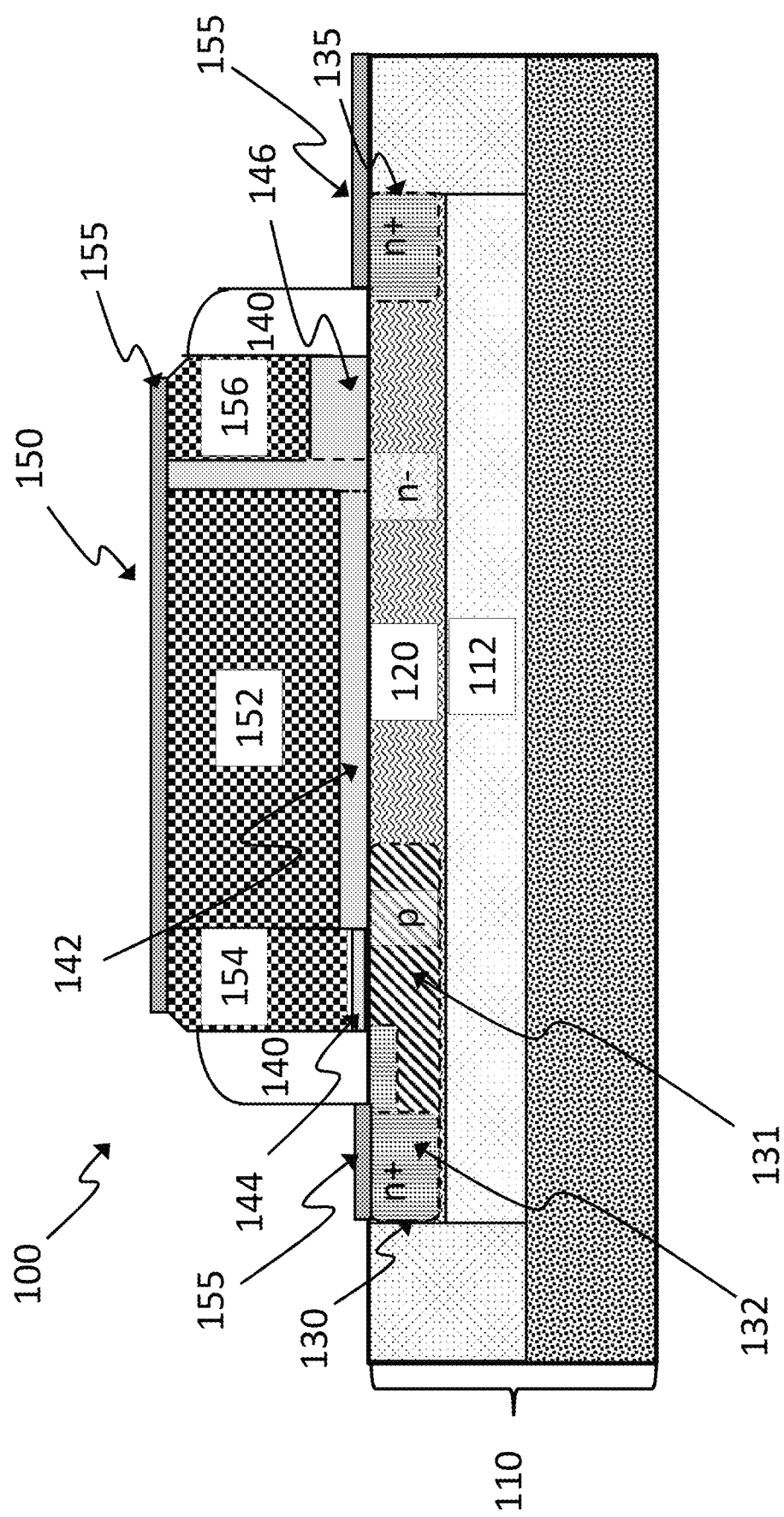
FIG. 1 is a cross-sectional schematic view of an example device according to embodiments disclosed herein.

The present invention will now be described more specifically with reference to the following embodiments.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B, and object B touches object C, then objects A and C may still be considered coupled to one another—even if they do not directly physically touch each other. For instance, a first object may be coupled to a second object even though the first object is never directly physically in contact with the second object. The terms "circuit" and "circuitry" are used broadly, and intended to include both hardware implementations of electrical devices and conductors that, when connected and configured, enable the performance of the functions described in the present disclosure, without limitation as to the type of electronic circuits, as well as software implementations of information and instructions that, when executed by a processor, enable the performance of the functions described in the present disclosure.

It should be understood that the figures are for purposes of illustration and that various elements are not to scale for ease of understanding. Directional references such as "top," "bottom," "side," "above," "over," "below" and similar references refer to the orientation of the figures unless explicitly stated and are not meant to require any particular orientation unless explicitly stated.

While conventional silicon and silicon-on-insulator devices are attractive for their low costs and ease of integration with other ubiquitous silicon-based semiconductor devices such as conventional microprocessors, these devices have disadvantages. In particular, conventional silicon devices have limited maximum switching speeds and poor power-handling. The operation frequency of a silicon MOSFET may be tuned by varying structural details such as gate dielectric materials and thicknesses. However, modifications that raise operating frequencies such as thinning the gate dielectric typically result in lower breakdown voltages and other undesirable characteristics such as increased gate-induced drain leakage (GIDL).

Compound semiconductor devices including III-V semiconductor devices (e.g., GaAs, GaN, et al.) can achieve higher operating frequencies and better power handling (i.e., greater current densities) in RF amplifier applications. However, compound semiconductor manufacturing is not as cost effective as silicon-based semiconductor manufacturing. And further, compound semiconductor devices are not readily integrated with pervasive silicon devices. Although silicon-on-insulator (SOI) technologies can improve performance through reduced substrate capacitance and other factors, SOI-based RF devices are still subject to trade-offs between operation frequency, breakdown voltages, and leakage.

Important performance characteristics of MOSFETs include maximum operating frequency (as represented by a unity gain cut-off frequency), various breakdown voltages (e.g., gate-to-drain breakdown, gate-to-source breakdown, gate-to-well breakdown, drain-to-source breakdown), on-state resistance, parasitic capacitance, and so on. For MOSFETs used as amplifiers, derived performance characteristics such as the product of the voltage gain and the operating bandwidth ("gain-bandwidth product") and the product of the breakdown voltage and cut-off frequency ("BVCEO-Ft product"). Typically, the high gain comes at the expense of operating bandwidth and vice versa. Similarly, high breakdown voltage typically comes at the expense of unity gain cut-off frequency and vice versa. Doping choices and device geometry influence breakdown voltages in addition to other parameters. Another component of device breakdown is the gate dielectric. Thin gate dielectrics may improve on-state resistance, but they are more susceptible to breakdown at high voltage. Thus, in conventional MOSFETs, it is impossible to improve device performance by thinning the gate dielectric without compromising resistance to breakdown at high operating voltages. Other performance characteristics such as gate-induced drain leakage (GIDL) are also subject to trade-offs.

In conventional MOSFET structures, increased drain voltages may cause the depletion region formed at junction between the drain and channel regions to extend beneath the gate electrode, resulting in a shortened effective channel length, lower output resistance, and degraded gain when operated as an amplifier. It is therefore preferable to extend the depletion region into the drain side drift region instead, thereby increasing the breakdown voltage and increasing the output resistance, resulting in higher gain when the MOSFET is operated as an amplifier.

In conventional silicon MOSFETs, switching speeds may be increased by reducing the channel length. In order to avoid drain-induced barrier lowering (DIBL), the channel doping must be increased, which will tend to raise the threshold voltage (Vt) of the device. When the channel doping is increased, the gate dielectric must be made thinner to avoid raising Vt. However, thinning the gate dielectric will typically result in undesired effects such as lowered breakdown voltages and increased GIDL.

Devices and methods disclosed herein allow for increased effective channel doping without the usual unwanted side effects of reduced breakdown voltages, enabling silicon-based RF amplifiers, switches, and other devices that can realize higher operating frequencies than conventional silicon devices (including SOI devices) without suffering from the same compromises in terms of breakdown-free operation at high voltages and other important characteristics. For example, devices and methods disclosed herein can enable RF switches with reduced spurious harmonic generation. Harmonics in MOSFET-based RF switches are associated with gate-induced drain leakage (GIDL). Because GIDL is related to tunneling between energy bands, it increases exponentially with increased voltage. Silicon-based devices with a low GIDL and methods for fabricating such devices according to embodiments disclosed herein are described further below. Such devices may be desirable for their low costs, reduced device sizes, and ease of integration with ubiquitous wireless devices utilized in silicon semiconductor technologies.

Some aspects of the present disclosure are discussed below with reference to example devices and methods for manufacturing such devices. Although certain example devices and methods disclosed herein are discussed in the context of silicon-on-insulator technology, it should be understood that the disclosed improvements may be applied to bulk-silicon-based devices and other device semiconductor platforms.

FIG. 1 is a cross-sectional schematic view of an example silicon-on-insulator device 100 suitable for use as a radio-frequency (RF) amplifier. The device 100 is a MOSFET fabricated on a SOI substrate 110 having a buried oxide 112 with an n-type silicon body 120 above it. For purposes of illustration, the example device 100 and other devices are shown as n-channel transistors having n-type source and drain (e.g. the source 130 and drain 135) and a p-type channel (e.g., the p-type well 131 forming a channel). However, it will be appreciated that methods disclosed herein are equally applicable to fabrication of p-channel transistors by substituting n-type doping for p-type doping and vice versa as appropriate.

A source 130 may be formed by a highly-doped n-type (n+) well 132 formed within a p-type-doped p-type well 131, which forms a channel together with the n-type body 120. A drain 135 is formed by a highly-doped n-type (n+) well. The device 100 may be gated by a gate 150 that includes gate electrodes 152, 154, and 156, each separated from electrical contact with the active regions of the device by one or more dielectrics. The gate electrodes 152, 154, 156 may be formed from any combination of materials with suitable electrical conductivity and other properties. In some embodiments, the gate electrodes 152, 154, 156 may be formed from highly-doped (including degenerately-doped) polysilicon. Notably, the dielectric thickness between the active region(s) and gate 150 is different beneath each of the gate electrodes 152, 154, 156. The first dielectric material 140 and the second dielectric material 144 may be any suitable material(s) including, as non-limiting examples, silicon dioxide, silicon nitride, cerium oxide, hafnium oxide, et al.). The first dielectric material 140 may include one or more portions formed at different times (e.g., as indicated by the dashed line in FIG. 3A and by the spacers 343 of FIG. 3F).

As shown (and described further in connection with FIGS. 3A-E below), the gate electrodes 152, 156 are separated from the active regions by the first dielectric material 140, while the gate electrode 154 nearest the source 130 is separated from the p-type well 131 by a thinner, second dielectric material 144. A suitable electrically-conductive material 155 (e.g., any suitable metal or metal silicide) acts as a top contact for gate 150 as well as for source 130 and drain 135. Example of the electrically-conductive material 155 is such as but not limited to silicide formed with Titanium or Cobalt silicon diffusion salicidation process. Silicide with metal diffusion material such as Nickel is also viable with epitaxial growth of silicon that closes gaps between gates prior to the silicidation process.

In some embodiments, the gate electrodes 152, 154, 156 may have substantially vertical sidewalls, forming an angle of approximately 90° with a surface of the active regions, allowing the gate electrodes 152, 154, 156 to be used as masks for dopant diffusion during manufacturing of the device 100 (e.g., as described further in connection to FIGS. 3A-E below).

Compared to a conventional laterally-diffused metal-oxide semiconductor (LDMOS) device, the greater thickness of the first dielectric material 140 in the region 146 under the gate electrode 156 compared to the second dielectric material 144 can enable higher breakdown voltage by reducing the effective electric fields from the drain 135. Meanwhile, the relatively low thickness of the second dielectric material 144 can enable high gain without substantially compromising the ability of the device 100 to withstand high applied voltages. The dimensions of the example device 100 may be chosen to obtain desired performance characteristics. Notably, using methods disclosed herein it is possible to achieve a breakdown-voltage-cutoff-frequency product of at least 150 GHz-Volts in a device similar to the example device 100. It will be understood that the thickness of the dielectric material 140 in the region 146 under the gate electrode 156, the thickness of the dielectric material 144, and the thickness of the dielectric material 140 in the region 142 under the gate electrode 152 may be independently tuned to suit various applications.

For instance, the use of a relatively thin dielectric material 144 enables high transconductance. Meanwhile, choosing a larger thickness for the dielectric material 140 in region 146 relative to the thickness of the dielectric material 140 in region 142 (together with the lateral dimensions of the gate electrode 152) can be used to improve the high-voltage endurance of the device near the drain 135. Typically, a thickness of 20 nm for the dielectric material 140 in the region 146 with proper drain engineering is sufficient for the example device 100 to withstand applied drain-to-gate voltages of ~20V when the dielectric material 140 is silicon dioxide. Breakdown-free operation at higher voltages is also possible by further increasing the thickness of the dielectric 140 in the region 146 underneath the gate electrode 156.

The example device 100 is a modified n-channel laterally-diffused metal-oxide-semiconductor (LDMOS) transistor. When device 100 is in the active mode, current may travel from the source 130 to the drain 135 under an applied drain-source bias voltage. Since the current is carried by electrons, device characteristics may be understood by considering an electron current flowing from the source 130 to the drain 135. The gate electrode 154 nearest the source 130 is separated from the p-type channel well 131 by a thin second dielectric material 144 that may be made significantly thinner than the thickness of the first dielectric material 140 under the other gate electrodes 152, 156 in the region 142 and the region 146, respectively. Breakdown voltage may be further improved by separating the channel well 131 from the drain 135 with a lightly n-doped body 120, resulting in a wide depletion region through which electrons may drift to the drain well 135 when the device is operated.

In some embodiments, the thin, second dielectric material 144 has a thickness of or less than 20 Å. The high effective capacitance between the gate electrode 154 nearest the source 130, and the channel well 131, can result in a higher carrier concentration there, resulting in lower on-state resistance compared to a conventional LDMOS FET with a uniform gate dielectric. While a similarly reduced on-state resistance may be achieved by thinning the gate dielectric of a conventional device, doing so would result in undesirable increases in leakage currents (due to GIDL) and undesirable decreases in blocking voltage.

Features of the example device 100 may be further understood using example parameters. For example, the breakdown voltage of the example device 100 will depend on the depletion region formed near the drain underneath the region 146. If the dielectric material 146 is silicon dioxide with a thickness of 200 Å, and no lightly doped drain (LDD) implant is used for the drain 135, the dielectric breakdown voltage may be expected to be at least 20V, allowing safe operation at 15 Vpeak. A drift region is formed under the gate electrode 152. During active mode operation in which Vd>Vg the drift region is depleted of carriers near the surface and carriers flow at depth away from the surface. As a result, the effective gate dielectric thickness in the drift region under the gate electrode 152 is equivalent to the thickness of the dielectric material 140 in that region plus the depth of the depleted surface region (modified by the appropriate dielectric constants). As a result, the thickness of the dielectric material 140 in the region 142 under the gate electrode 152 may be made thinner to improve the linear mode on-state conductance of the channel. In addition, the pn junction formed between the body 120 and the p-well 131 is now gated, thereby enhancing the breakdown voltage and overall BVCEO of the parasitic npn bipolar transistor formed by the n-type source 132, the p-type well 131 and the n-type body 120 (together with the n-type well at the drain 135) which partly limits the high-voltage handling capacity of the example device 100. The doping of the p-well 131 may be in the range of 1.0E18 cm-3, which is considerably higher than typical high-voltage LDMOS devices thanks to the use of the thin dielectric material 144. The high doping of the p-well 131 reduces the injection ratio and current gain of the parasitic BJT and thus improves the breakdown voltage of the example device 100.

The dimensions of the example device 100 may be chosen such that the total drift length from the edge of the drain 135 to the edge of the p-well 131 is greater than four times the thickness of the body 120 in order to nearly eliminate drain induced barrier lowering (DIBL) effects. As a non-limiting example, a thickness of the body region 120 may be chosen to be 500 Å and a length defining a drift region of ~200 nm. The lateral distance between the edge of the gate electrode 152 nearest the drain 135 and the drain 135 may be chosen as 100 nm or any other suitable value.

By way of example, a device similar to the example device 100 may be configured for use as an RF amplifier with a breakdown voltage between 5V and 20V. The thickness of the body 120 in this example is 50 nm, with a buried oxide of 400 nm beneath it. A length of the first gate electrode 152 between ~200 and 1000 nm is desirable for certain applications and will determine the breakdown voltage of the device.

The thickness of the dielectric material 142 under the central gate 152 may be chosen to optimize the drain current at the onset of pinch-off, which partially determines the power handling capability of the device 100. The thickness of the thin dielectric material 144 under the second gate electrode 154 is selected thin for best performance now that high voltage bias is shielded. The thickness of dielectric material in region 146 on the third gate electrode 156 is selected to withstand the drain voltages applied during operation of the device.

For certain applications, it is desirable for the cumulative width of the gate electrode 152 and 156 to be ~4× the thickness of the body 120 to suppress DIBL effects. The width of the gate electrode 154 and the doping underneath it may be adjusted to set threshold voltage and to tune the on-state resistance. The high-voltage tolerance of the device 100 may be further increased by using a larger width of the gate electrode 156 and underneath gate dielectric thickness.

Figure 2:
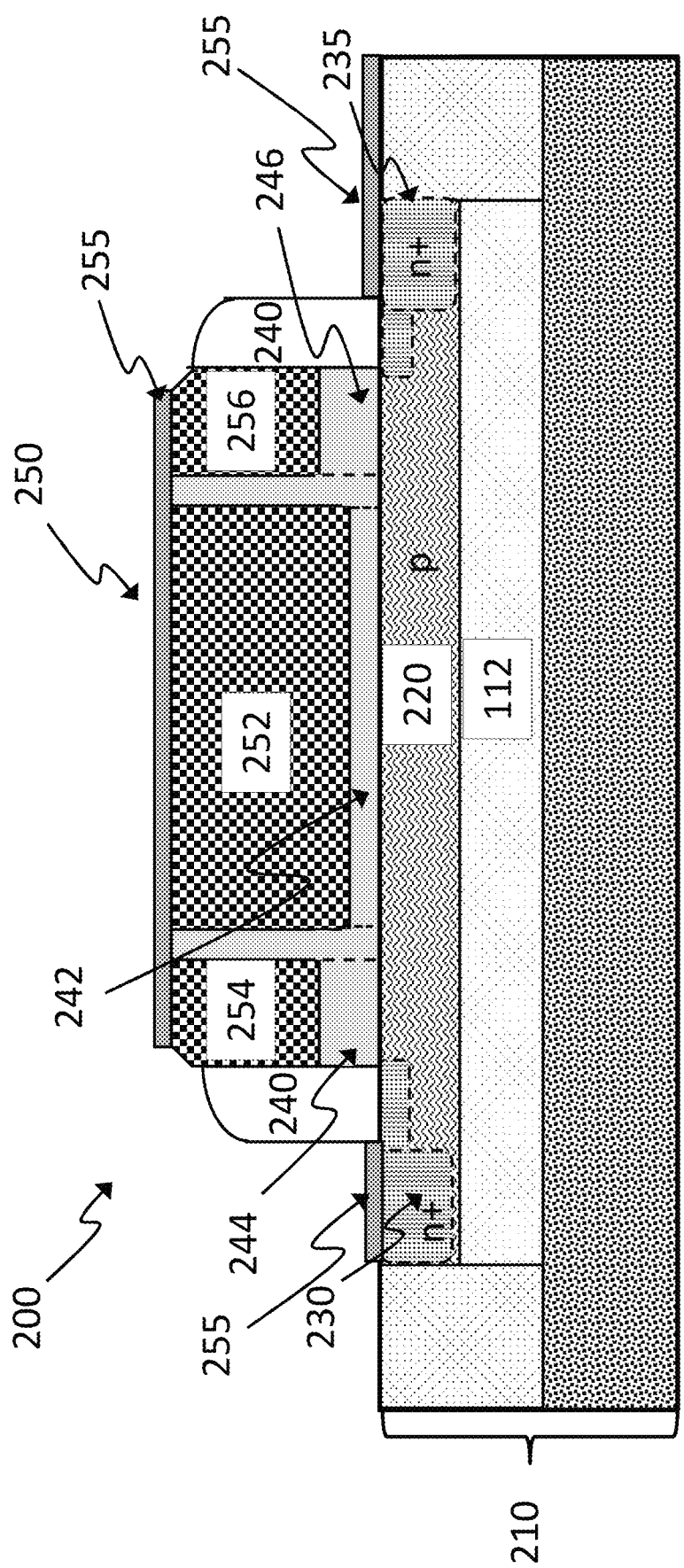
FIG. 2 is a cross-sectional schematic view of another example device according to embodiments disclosed herein.

FIG. 2 is a cross-sectional schematic view of an example silicon-on-insulator device 200 (a modified n-channel MOSFET) suitable for use as an RF switch. Although the device 200 is similar to the device 100 and may be fabricated using many of the same processing steps, it is optimized for use as a switch rather than an amplifier. For this reason, an ultrathin gate dielectric (e.g., the second dielectric material 144 of FIG. 1) is not necessary under gate 254. Thus, in example device 200, the gate 250 is separated into the central gate electrode 252 and two symmetrically-located and dimensioned extension gate electrodes 254, 256. The gate electrodes 252, 254, 256 may be formed from any combination of materials with suitable electrical conductivity and other properties. In some embodiments, the gate electrodes 252, 254, 256 may be formed from highly-doped (including degenerately-doped) polysilicon. As will be described below, the dielectric material 240 is patterned to create a smaller gap between the central gate electrode 252 and the channel 220 than between the additional gate electrodes 254, 256 and the channel 220. The gate electrodes 252, 254, 256 may be electrically coupled (e.g., shorted to each other) by electrically-conductive material 255 (e.g., the electrically-conductive material 155) which may be any suitable metal or metal silicide, and which may also be patterned to form electrical contacts to the source 230 and the drain 235.

By way of example, a device similar to the example device 200 may be configured for use as an RF switch or an RF antenna tuner with a breakdown voltage between 5V and 20V. The thickness of the body 220 in this example is 50 nm, with a buried oxide of 400 nm beneath it. A length of the first gate electrode 252 between ~50 and 1000 nm is desirable for certain applications. The thickness of dielectric material in the regions 244, 246 under the second and third gate electrodes 254, 256, respectively is selected to withstand the drain voltages applied during operation of the device and to reduce harmonics due to GIDL thus a thickness higher than 252. For these purposes the thickness of 20 nm for the dielectric layer 240 in the regions 244, 246 may be suitable. For certain applications it is desirable for the cumulative width of the gate electrodes 250 to be ~4× the thickness of the body 220 to reduce DIBL effects.

Suitable gate electrodes (e.g., the gate electrodes 252, 254, 256) may be polysilicon with a thickness of ~200 nm, with a spacing of 20 nm between each of the gate electrodes 254, 256 and the gate electrode 252.

In the device 200, the gap between the central gate 252 and the extension gate electrodes 254, 256, considered in isolation might be expected to increase on-state resistance. However, when a conventional FET is over-driven (i.e., Vg>>Vth), carrier mobility often suffers. When the device 200 is over-driven, the dielectric thicknesses under the gates 254, 256 may be chosen such that the carrier mobility remains normal under the regions 244, 246, the low GIDL current resulting in low harmonic distortion and higher breakdown voltage than in a conventional device with a modest increase in on-state resistance (~10-15%) when compared to a conventional transistor without the extension gates 254, 256 as described herein.

FIGS. 3A-3F are cross-sectional schematic views of an example device 300 at selected points during an exemplary manufacturing process, provided to illustrate steps in an example process suitable for manufacturing an example device 300 (e.g., the example device 100 of FIG. 1). While FIGS. 3A-3F illustrate fabrication of a device suitable for use as an RF amplifier, it should be understood that the methods disclosed herein are applicable to other devices and other semiconductor technologies (e.g., non-SOI silicon-based devices, compound semiconductor devices, etc.), with appropriate modifications, as discussed below.

Figure 3A:
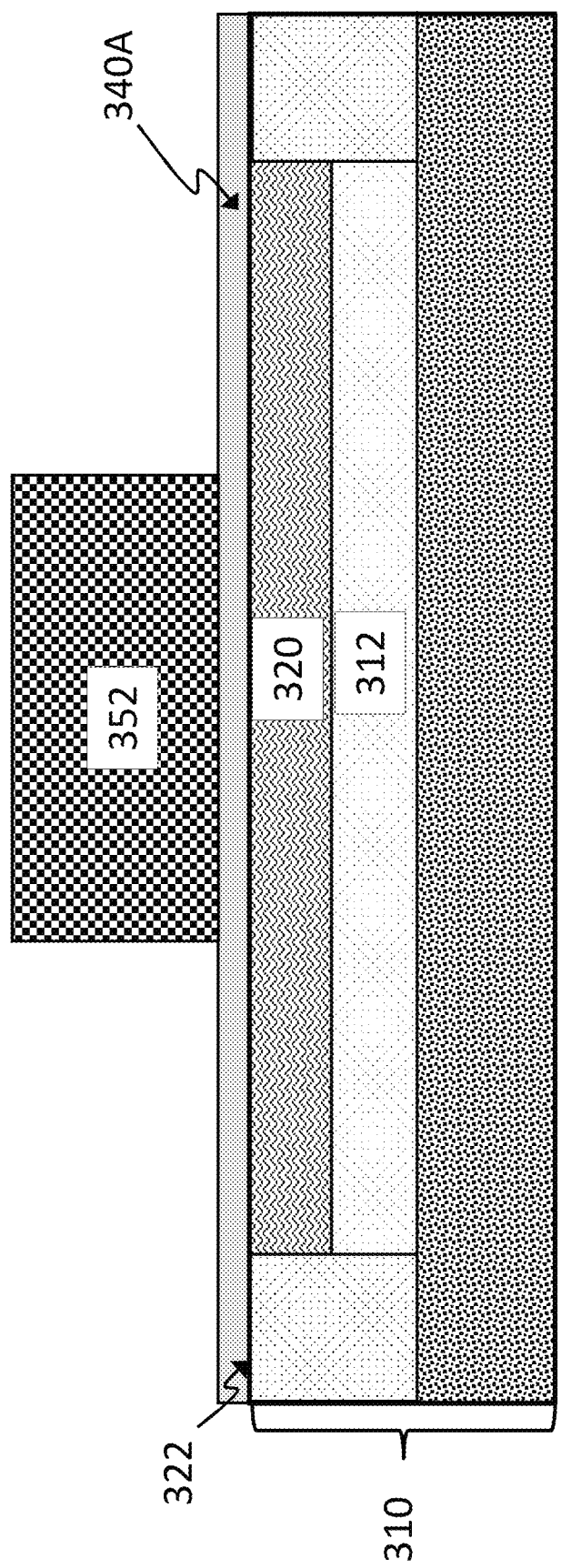
FIGS. 3A-3F are cross-sectional schematic views depicting a device such as the device of FIG. 1 at different stages of fabrication according to embodiments disclosed herein.
Figure 3B:
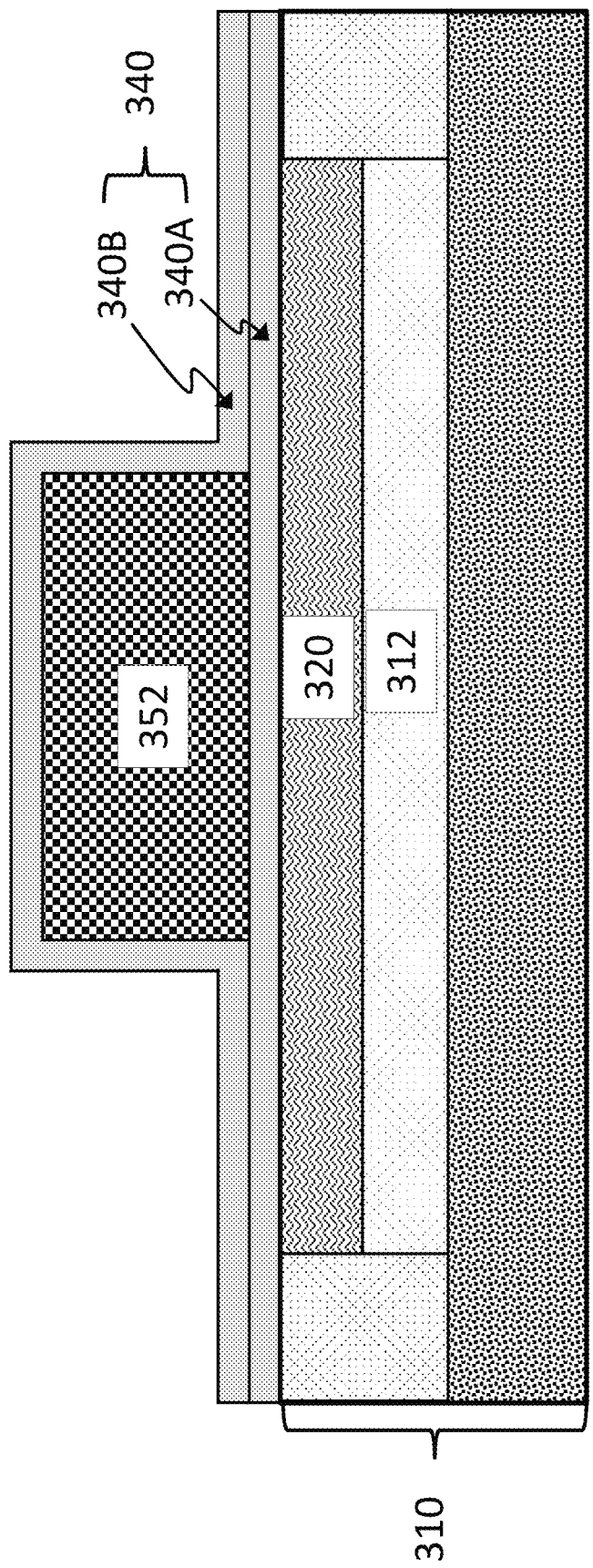

As shown in FIG. 3A, a semiconductor substrate 310 is provided. For purposes of illustration, the substrate 310 is shown as an SOI wafer with a buried oxide layer 312 and a silicon body 320 over the buried oxide 312. As shown, the semiconductor substrate 310 may be provided with a gate electrode 352 formed above the region body 320 to form what will become part of a gate structure 350 (e.g., the gate 150 of FIG. 1). As shown the gate electrode 352 is surrounded by a dielectric material 340. In some embodiments, the substrate 310 may be provided with only a lower dielectric material 340A forming the lower portion of the first dielectric material 340 present (denoted by dashes), in which case an upper dielectric material 340B may be formed later. The substrate 310 is shown as a partially-depleted SOI wafer. However, in some embodiments, a fully-depleted SOI wafer may be used.

In some embodiments, the substrate 310 may be provided without the first dielectric material 340 and without the gate electrode 352. In such embodiments, a method may include forming the lower portion 340A of the first dielectric material 340 and the gate electrode 352 using any suitable method. The first dielectric material 340 may be any suitable material including, as non-limiting examples, various oxides and nitrides (e.g., silicon dioxide, hafnium oxide, cerium oxide, silicon nitride, boron nitride, et al.) and combinations thereof.

Figure 3C:
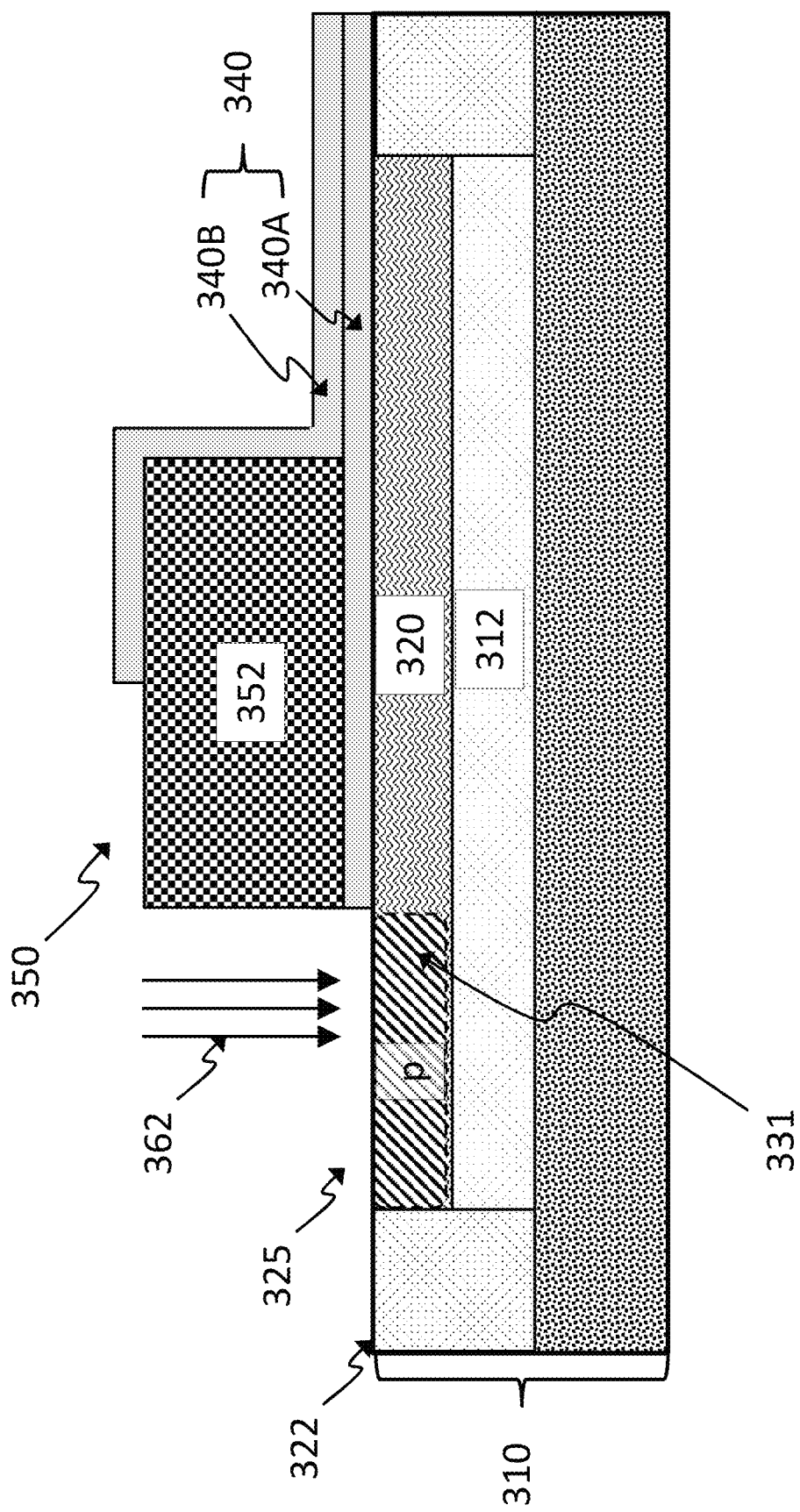

As shown in FIG. 3C, the first dielectric material 340 may be patterned via photolithography and etching, or any other suitable combination of processes to expose the region 325 on the top surface 322 of the substrate 310 next to the gate electrode 352. In some embodiments, the first dielectric material 340 is silicon dioxide and may be patterned by etching areas exposed after photolithographic resist development using a solution of hydrofluoric acid (HF). As shown, the gate electrode 352 may be used as a hard mask for a dopant implantation 362. As shown, the dopant implantation 362 may create a p-type well 331 within the body 320, which may be lightly n-doped. As will be discussed, part of this volume may form a source well 330 of a completed device 300 (as described further below in connection with FIG. 3F). The dimensions of the p-type well 331, or at least a portion of its dimensions, may thus be self-aligned to the nearest edge(s) of the gate electrode 352.

Due to carrier mobility with the silicon material, the compact device size is necessary to yield desirable high speed RF performance. Prior arts feature split gate structure form split gate oxides followed by aligning a gate structure over the split gate oxide through common alignment target, which render device miniature difficult. The proposed method places the alignment over gate 152 as shown in FIG. 3C to effectively eliminate the alignment tolerance burden on device size reduction.

As shown in FIG. 3C, a thin dielectric material 344 may be formed over the region 325. In some embodiments the thin dielectric material 344 may be silicon dioxide formed using a thermal oxide process. The thickness of the second dielectric material 344 may be chosen to achieve desired performance characteristics of the device 300. In particular, since the dielectric material 344 will form the gate dielectric between the gate electrode 354 and the body 320 of the finished transistor in the region 325 (as will be described further below), that thickness will at least partially determine the on-state resistance of the device 300 and its cut-off frequency. As shown, the dielectric material 340 may be patterned such that the thickness of the dielectric material 340 is thicker in the region 346 than in the region 344.

In some embodiments, thicknesses as low as realistically achievable without causing shorting may be desirable. Device performance can be tuned to optimize for different characteristics. For instance, as the dielectric material is made thinner, the drive current will increase. Similarly, as the thickness of the dielectric material 344 is increased, the drive current will be decreased. Any suitable thicknesses of the various dielectric materials may be chosen depending on characteristics desired for a particular application.

For most applications, an oxide layer having a thickness of 16-100 Å may be used for the dielectric material 344. It will be appreciated that other materials, including high-K dielectrics, and any other suitable dielectric may be used to further tune desired performance characteristics.

Figure 3D:
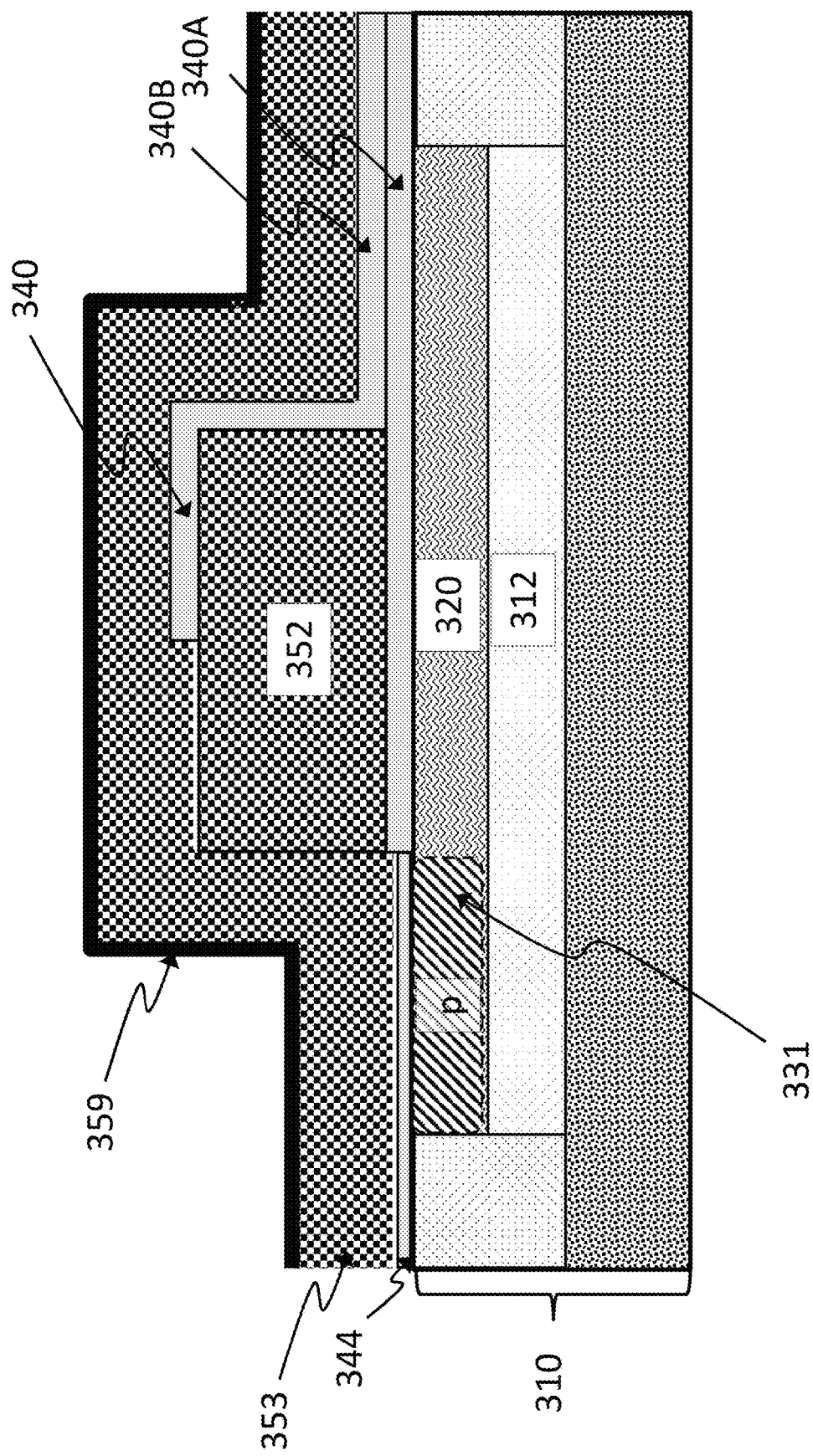
Figure 3E:
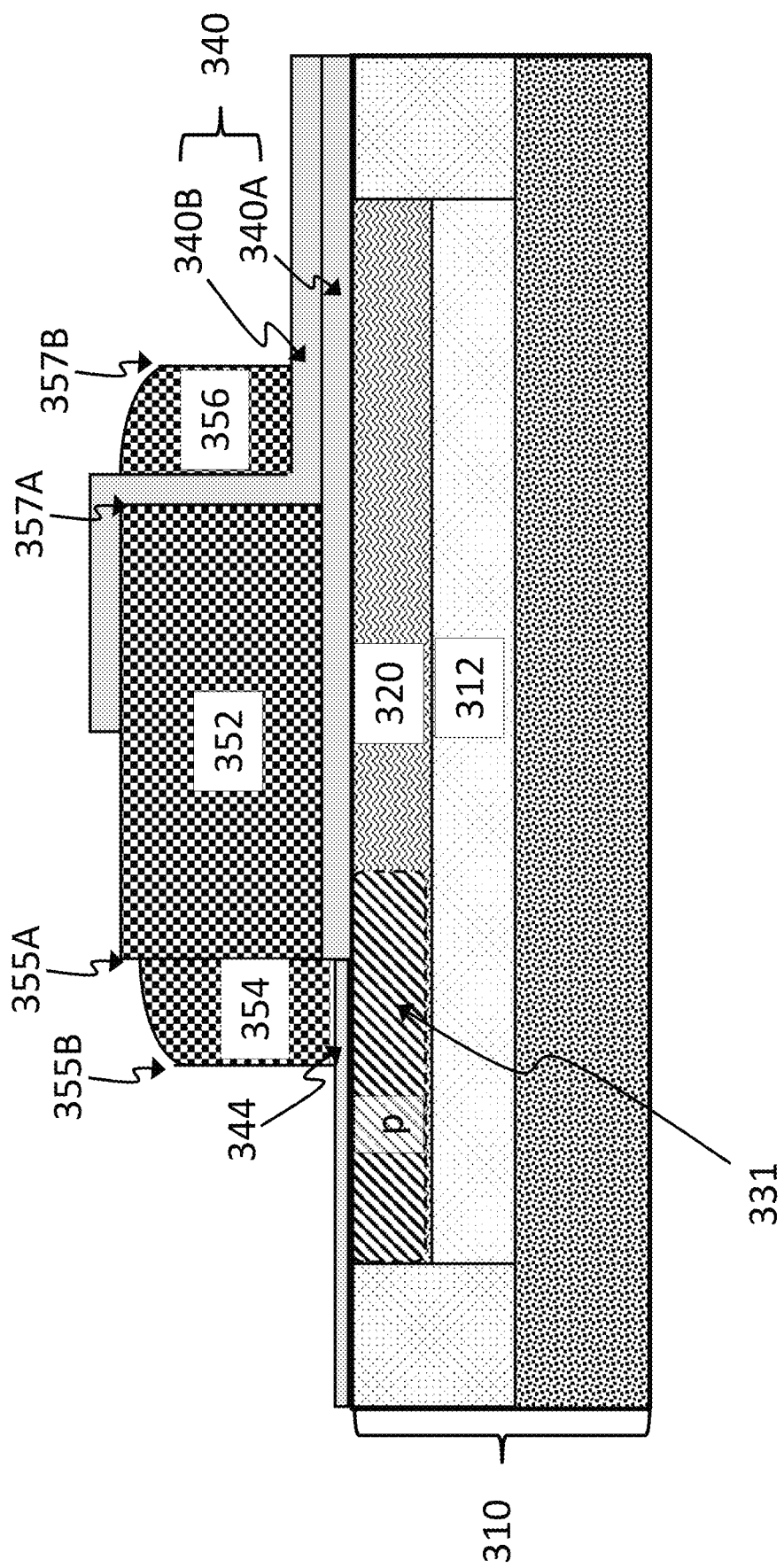

As shown in FIG. 3D, an electrically-conductive layer 353 may be deposited over the structure of FIG. 3C and patterned to form the structure in FIG. 3E. The conductive layer 353 may be any suitable material including metals and/or highly-doped polysilicon. Notably, the thickness of the-conductive layer 353 may be chosen such that the electrically-conductive layer 353 can be patterned using anisotropic etching without the need for a separate lithographic step. By choosing a suitably anisotropic etching process (e.g., reactive ion etching at low pressures as a non-limiting example) the portions of the electrically-conductive layer 353 above the gate electrode 352 and above the region 325, may be removed while leaving portions of the layer 353 along the sidewall 355 of the gate electrode 352 and the sidewall 357 of the patterned dielectric material 340 intact, thereby forming the extension gate electrodes 354, 356 (e.g., the gate electrodes 154, 156 of FIG. 1). Such non-lithographic processes may be used to produce fine nanometer-scale structures without requiring the expense of additional masks and equipment capable of nanometer (or sub-nanometer) mask alignment. An over etch required to clear layer 353 residue may cause extension gate electrodes 354, 356 height lower than central gate electrode 352.

Figure 3F:
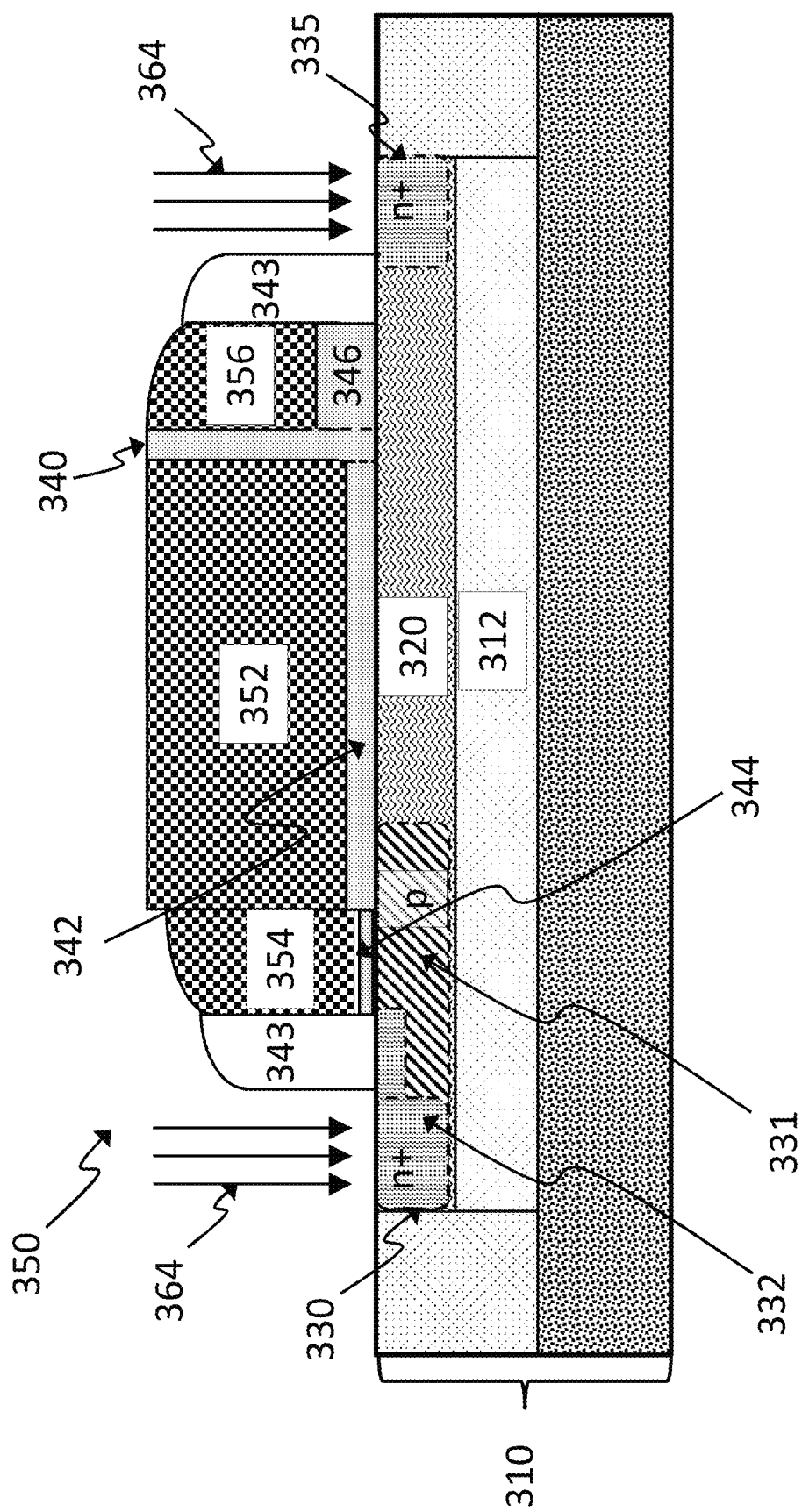

In some embodiments, to aid in subsequent patterning of the structure of FIG. 3D to form the structure of FIGS. 3E and 3F, a thin oxide layer (e.g., the oxide layer 359) or other layer may be deposited over the electrically-conductive layer 353 as shown in FIG. 3D. When subject to a suitably anisotropic selective etching process (e.g., low-pressure etching in HBr:Cl plasma) that preferentially removes material in a direction perpendicular to the surface of the substrate, this oxide coating protects the sidewalls of the electrically-conductive layer 353 from etching, resulting in the substantially vertical sidewalls 355A,B and 357A,B of the respective extension gate electrodes 354,356 as shown in FIGS. 3E-3F. The protective oxide coating ensures vertical gate electrodes 354, 356 has a consistent dimension, are not shorted to the source or drain doped well in the volume production.

It will be appreciated that the descriptions herein are for the purposes of illustrating key features of embodiments disclosed herein and may omit various well-known processing steps. For instance, in some embodiments where polysilicon is used as a gate electrode material, a liner oxide may be deposited or thermally grown as part of a polysilicon annealing process to drive diffusion of heavy n-type dopants into the polysilicon. Such liner oxide layers may be ~50-200 Å thick and may be removed by RIE before etching the polysilicon to pattern the gate electrodes. This allows for control of critical dimensions ("CD control"). Subsequent formation of the dielectric spacers 343 formation prevent shorting of the source and drain to the respective gate electrodes 354, 356 during silicide formation.

As shown in FIG. 3F, dielectric spacers 343 may be patterned adjacent to the extended gate electrodes 354, 356. The dielectric spacers 343 may be used as a hard mask for a dopant implantation process 364 that may be used to form source and drain wells. As shown the source and drain wells are doped n+. The extents of the source well 332 and drain well 335, as well as the interface between the source well 332 and the channel well 331, and between the drain well 335 and the body 320, may be further defined by one or more thermal annealing steps. In some embodiments in which the gate electrodes 354, 356 are polysilicon, one or more annealing steps may also be used to diffuse dopants within the gate electrodes 354, 356 to ensure that they have sufficient electrical conductivity. In some embodiments, a thermal annealing step may be used to repair etching damage introduced by reactive ion etching of the gate electrodes 354, 356 and additional annealing to further diffuse dopants introduced by the doping process 364 and/or the doping process 362. In some embodiments, the doping profiles of the source, drain, and channel are configured to transition gradually at the interface between the channel well 331 and the body 320, thereby reducing high field gradients associated with abrupt junctions.

Additional conventional steps not shown explicitly may include lateral dopant diffusion to form the arrangement of the doped source and drain regions shown in FIG. 3F, and deposition and patterning of the spacers 343, as well as deposition of source and drain contacts which may be formed from a silicide, metal, or any other suitable material. It will be understood that geometries of the doped regions pictured will be altered if fully-depleted SOI is used; for example, the p-type well 331 and the n-type well forming the drain 335 may extend to the bottom of the body 320 at the interface with the buried oxide 312.

Figure 4:
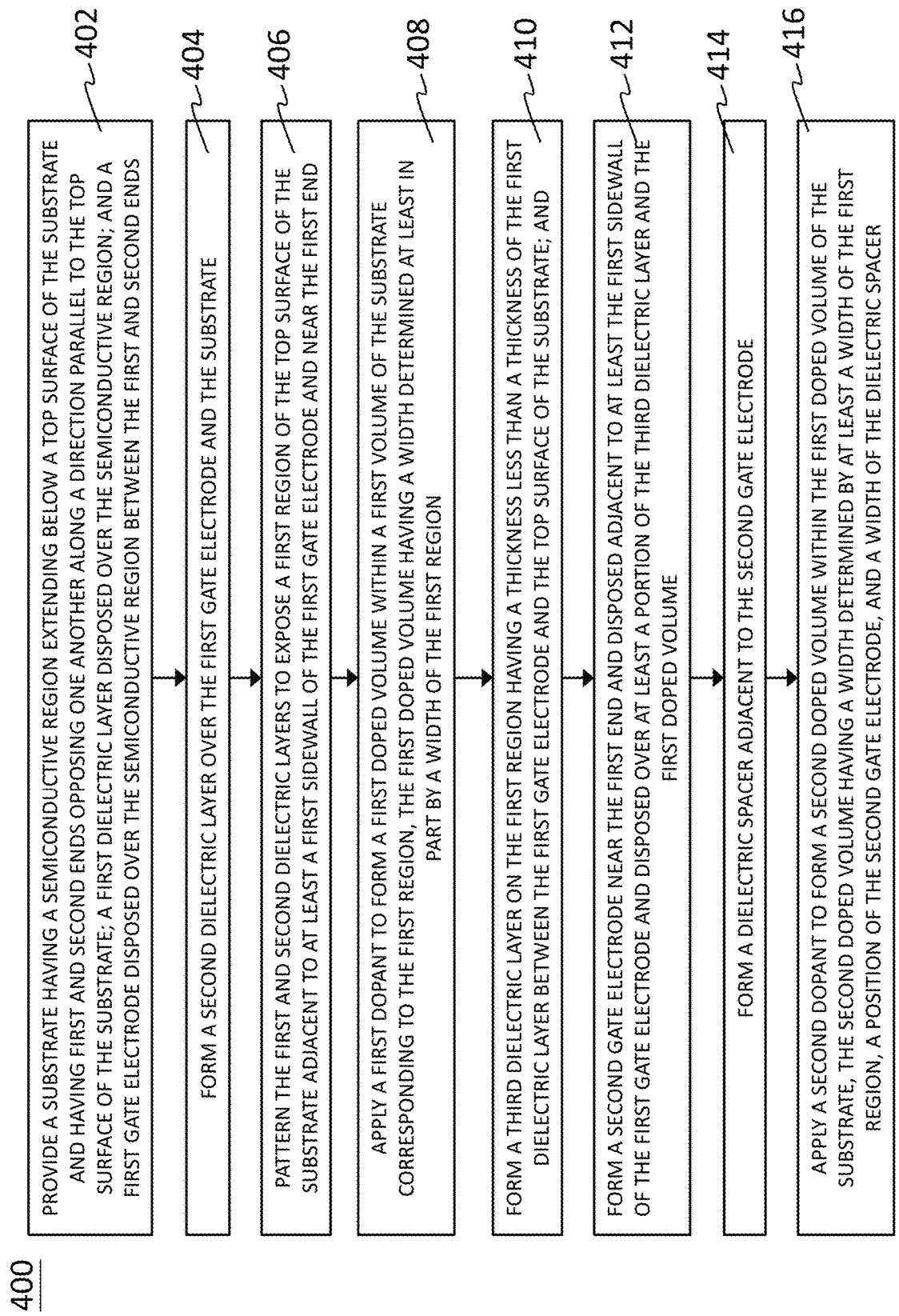
FIG. 4 is a flow diagram of an example transistor fabrication process according to some embodiments.

FIG. 4 shows a flow diagram illustrating an example process 400 for fabricating a transistor (e.g., the example device 100). As described below, some or all illustrated features may be omitted in a particular implementation within the scope of the present disclosure, and some illustrated features may not be required for the implementation of all embodiments. The example process 400 has steps 402, 404, 406, 408, 410, 412, 414, 416. These steps may be performed by a human operating semiconductor fabrication equipment, automated control systems operating such equipment, or by any combination thereof, described for purposes of illustration as a single "operator." In some examples, process 400 may be carried out by any suitable apparatus or means for carrying out the functions or algorithm described below. In some examples, the sequence of steps 406 and 408 may be reversed to allow implantation through the oxide.

At step 402, an operator provides a substrate having a semiconductive region (e.g., body 320 of FIG. 3) extending below a top surface of the substrate. The substrate has first and second ends (e.g., the source 330 and drain 335 of FIGS. 3A-3F) opposing one another along a direction parallel to the top surface of the substrate; a first dielectric material disposed over the semiconductive region (e.g., the lower dielectric material 340 Å of FIG. 3); and a first gate electrode (e.g., the gate electrode 352 of FIG. 3) disposed over the semiconductive region between the first and second ends.

At step 404, an operator forms a second dielectric material (e.g., the upper dielectric material 340B of FIG. 3) over the first gate electrode and the substrate. The second dielectric may be silicon dioxide, silicon nitride, or any other suitable dielectric or combinations thereof and may be deposited by sputtering, physical vapor deposition, chemical vapor deposition, or any other suitable method.

At step 406, the operator patterns the first and second dielectric materials to expose a first region of the top surface of the substrate (e.g., the region electrode 325 as shown in FIG. 3C) adjacent to at least a first sidewall of the first gate electrode and near the first end. In some embodiments, patterning the second dielectric material includes first patterning photoresist to create an etch mask. The exposed areas of the second dielectric material as well as the first dielectric material within the first region may be removed using any suitable wet or dry etching process. As one non-limiting example, silicon dioxide may be removed by using a solution of hydrofluoric acid.

At step 408, the operator applies a first dopant (e.g., the dopant 362 shown in FIG. 3C) to the substrate to form a first doped volume within a first volume of the substrate corresponding to the first region. Because the substrate is exposed within the first region, the first doped volume has a width determined at least in part by a width of the first region. The first dopant may be applied using any suitable process(es) including diffusion of dopant from a coated layer or ion implantation. If the transistor is an n-channel transistor, the first dopant is chosen to create a p-doped region. If the transistor is a p-channel transistor, the first dopant is chosen to create an n-doped region.

At step 410 the operator forms a third dielectric material (e.g., the thin dielectric material 344 shown in FIG. 3C) on the first region with a thickness less than the thickness of the first dielectric material between the first gate electrode and the top surface of the substrate. The third dielectric may be silicon dioxide, silicon nitride, or any other suitable dielectric or combinations thereof and may be deposited by sputtering, physical vapor deposition, chemical vapor deposition, or any other suitable method. In some embodiments, the third dielectric material may be formed on the first region by using thermal oxidation of the top surface of a substrate in the first region.

At step 412, the operator forms a second gate electrode by patterning an electrically-conductive layer (e.g., conductive layer 353 shown in FIG. 3D, patterned as shown in FIG. 3E to form the two extension gate electrodes 354 and 356). The electrically conductive layer may be deposited by any suitable processes (e.g., chemical vapor deposition, sputtering, etc.) The second gate electrode is near the first end of the semiconductive region and disposed adjacent to at least the first sidewall of the first gate electrode and disposed over at least a portion of the second dielectric material and the first doped volume. In some embodiments, the second gate electrode may be patterned without the need to perform a lithographic step. For instance, as a non-limiting example, the electrically-conductive layer may be etched via highly anisotropic etching process such as reactive ion etching (RIE) that effectively removes the bulk of the electrically-conductive layer while leaving one or more portions of the electrically-conductive layer intact along sidewalls of the first gate electrode. The width of the second gate electrode may be controlled by choosing an initial thickness of the electrically-conductive layer.

The second gate electrode may be made as narrow as desired down to at least the scale of tens of nanometers without the need to perform high-resolution lithography and high-precision mask alignment. This step may optionally include forming a third gate electrode opposite the second gate electrode along an opposite sidewall of the first gate electrode (and near the second end of the semiconductive region). The second dielectric material need not be removed in the area corresponding to the third gate electrode. As a result, the third gate electrode may be separated from the semiconductive region by a greater thickness of dielectric material than the first gate electrode and/or the second gate electrode (see FIG. 1 for example). A significant benefit of the thick dielectric under the third gate electrode is reduced capacitance between the overall gate structure and the drain ("Cgd"). Reduced Cgd enables higher power gain and higher maximum operation frequencies (as measured by the highest frequency at which the gain is greater or equal to unity power gain). The extended gate structure enables high speed performance without power gain degrade due to high gate resistance Rg seen with conventional narrow gate structure.

At step 414, the operator forms a first dielectric spacer adjacent to the second gate electrode (e.g., one of the dielectric spacers 343 adjacent to the second gate electrode 354 as shown in FIG. 3F) by patterning a fourth dielectric material. The fourth dielectric material may be any suitable dielectric as previously described and may be deposited and patterned using any suitable process, including reactive-ion etching such as described above in connection to step 412. The first spacer may be used as a hard mask for application of a dopant which may be used to form a source well within the first doped volume. Accordingly, at step 416, the operator applies a second dopant to the substrate to form a second doped volume (e.g., the n+ well 332 shown in FIG. 3F) within the first doped volume of the substrate. The second doped volume has a width determined by at least a width of the first region, a position of the second gate electrode, and a width of the first spacer (see, for example, FIG. 3F and descriptions thereof). Step 414 may also include forming a second spacer adjacent to the third gate electrode in embodiments that include forming a third gate electrode as described above. In such embodiments, the second spacer may be used as mask through which the second dopant forms a third doped region usable as a drain of the transistor (e.g., see the third gate electrode 356, the spacers 343, and the drain 335 of FIG. 3F). The second dopant is chosen to introduce an opposite majority carrier type as the first dopant such that the source has opposite doping to the channel formed underneath the second gate electrode.

Figure 5A:
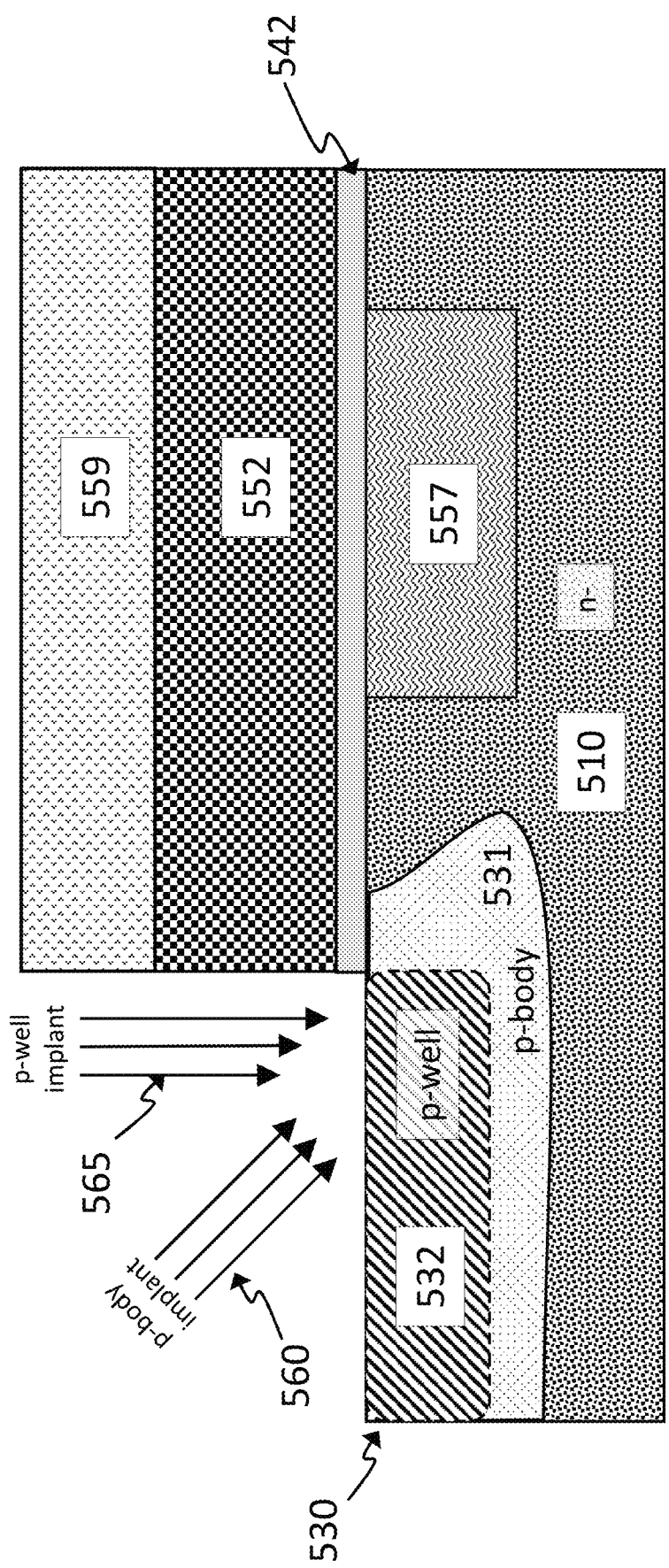
FIG. 5A is a cross-sectional schematic view of another example device according to embodiments disclosed herein.
Figure 5B:
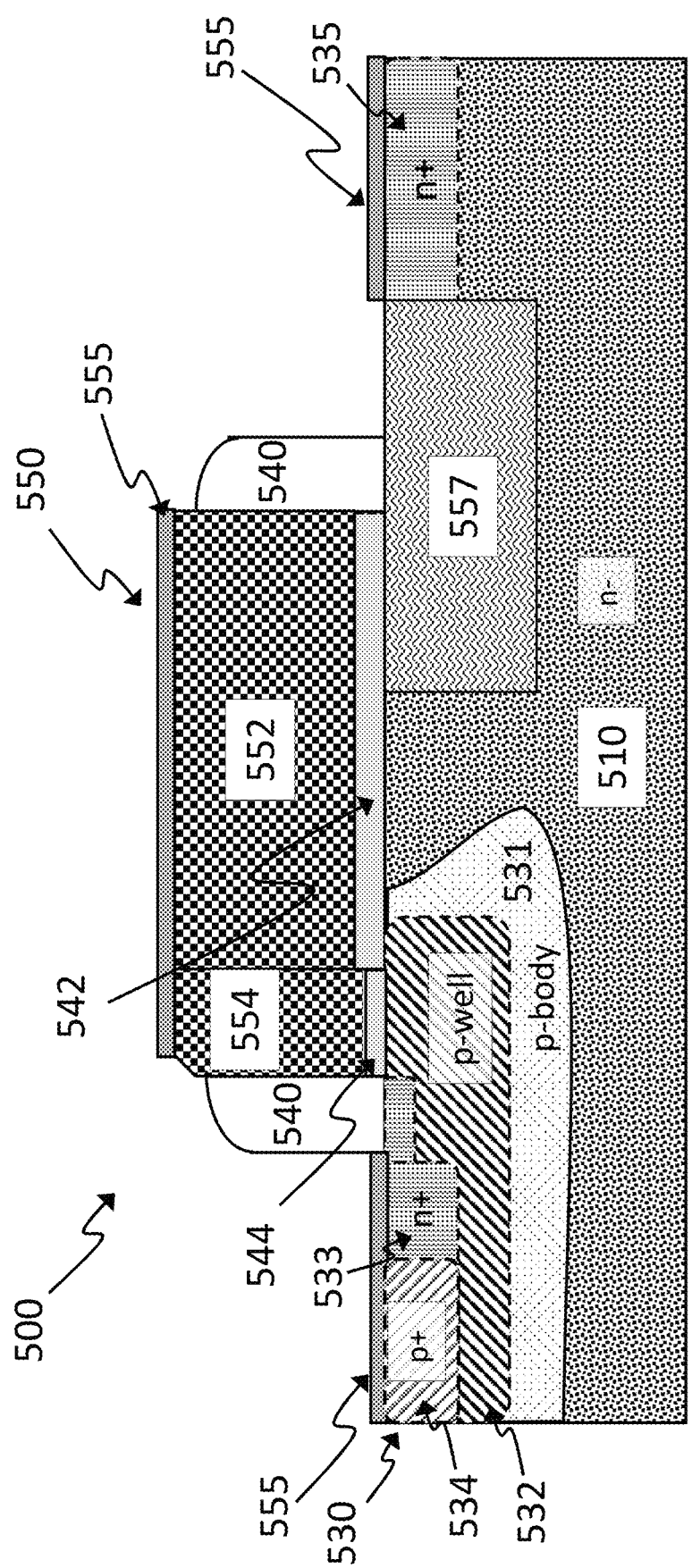
FIG. 5B is cross-sectional schematic view illustrated elements of a fabrication process of the device of FIG. 5A according to embodiments disclosed herein.
Figure 5C:
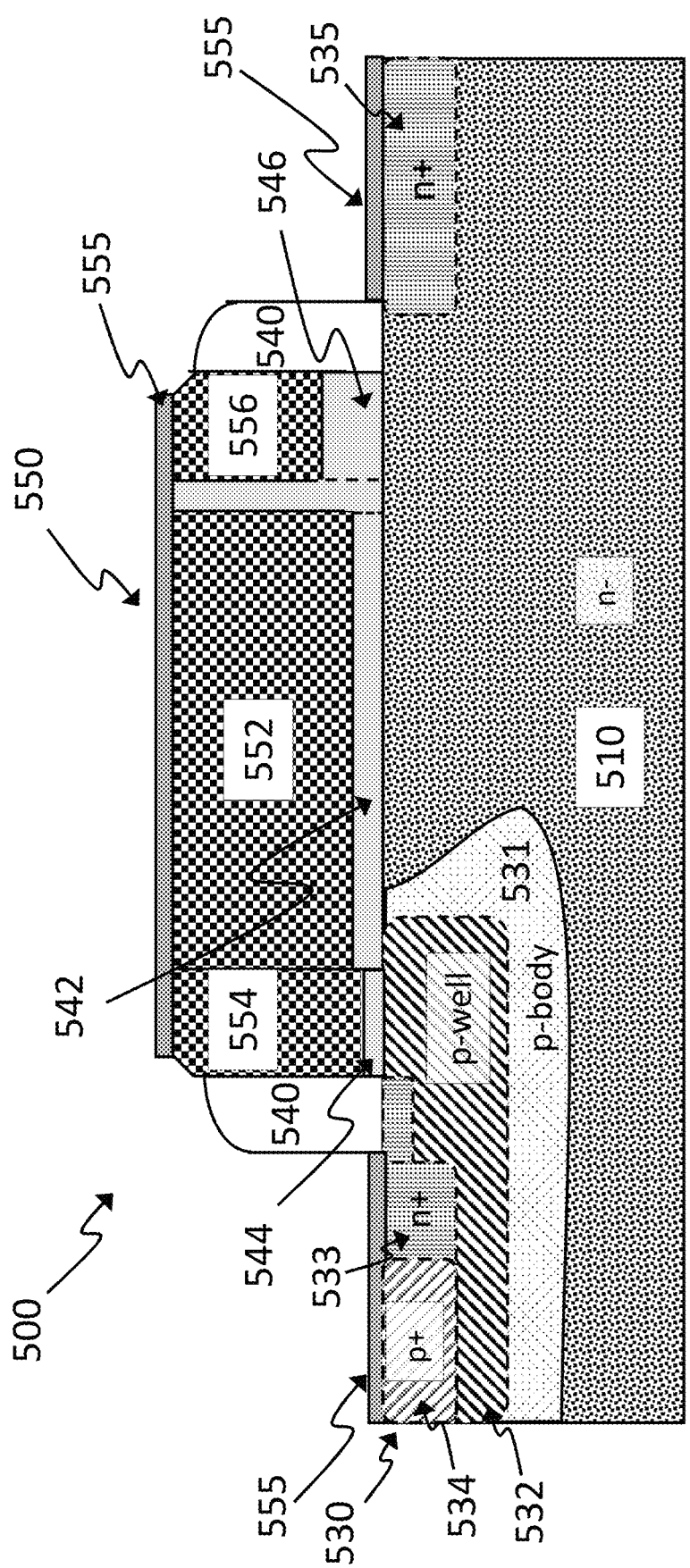
FIG. 5C is a cross-sectional schematic view of another example device according to embodiments disclosed herein.

In a further aspect of this disclosure, methods disclosed herein may be but not limited to non-SOI based devices, e.g., as illustrated by FIGS. 5A-5C. FIG. 5B shows an example device 500 suitable for use as a low loss power management device having similar features to the example device 100 of FIG. 1, fabricated using a conventional bulk semiconductor substrate 510. A SOI version is also desirable for compact device isolation and high speed switching to reduce external passive components size. The source well is formed by an n+ doped well 533 formed within a p-doped well 532. A p+ doped well 534 forms an Ohmic contact to p-doped well 532 and connect the n-doped source well 533. The extended gate electrode 554 width may be greater than 0.1 um.

A parasitic npn bipolar junction transistor is formed by the n-type well 533, the p-type well 532, and the n-type substrate 510. Leakage current under high voltage operation across the pn junction formed between the p-type body 531 and n-type body 510 flow toward the p-well contact 534 acts as a base current in the parasitic BJT. In a conventional device with a single thick gate dielectric, doping of the p-well 532 is usually approximately 5.0E16 cm-3 to achieve an acceptable threshold voltage. However, the high p-well resistance may forward bias the pn junction formed between the p-type well 532 and the n-type source well 533, causing failure. Using an extended gate electrode 554 enabled using a thin dielectric material 544, allows much higher dopant concentrations in p-type well 532 (e.g., ~1.0E17-1.0E18 cm-3) while retaining low on state resistance (Ron). This reduces the current gain of the parasitic BJT, thereby increasing BVCEO and overall high voltage handling capacity.

Further, the deep lightly-doped p-type body well 531 can isolate the source well 530 from the substrate 510, which may be doped lightly n-type. The lightly-doped p-type well 531 increases device breakdown voltage with a suitably large depletion region at the junction with the background doping of the substrate. Meanwhile, the thin dielectric material 544 enabled by methods disclosed herein allows the p-type well 532 to be heavily-doped, allowing a low-resistance path for reverse-bias current.

As shown, the n+ doped drain well 535 is coupled to the source well 530 through the lightly-doped substrate 510 and the p-type channel well 532. In this arrangement, the portion of the substrate 510 through which carries flow when the device is operated functions as a drift region, which acts as a depletion mode transistor channel when positively biased via the gate 550 which comprises a first gate electrode 552 and a second gate electrode 554 (similar to the gate electrodes 152, 154 of the device 100 of FIG. 1). The isolation trench 557 may be used to protect gate from high drain voltage where conventional thermal local oxidation (LOCOS) is also preferred for low cost. A large depletion region is formed between the deep p-body 531 and the n-substrate 510. The isolation trench reduces field concentration at the drain. Current is concentrated toward the channel which, together with a thin gate dielectric over the channel reduces the on-state loss while maintaining the high-voltage endurance of device.

Similar to device 100, device 500 has a thin dielectric material 544 between the gate electrode 554 and the effective channel, and a dielectric material 540 in the region 542 with a greater thickness than that of the dielectric material 544 between the gate electrode 552 and the drift region below it. The gate electrodes 552, 554, and the source well 530 and drain well 535 may be provided with electrical contacts by patterning a suitably electrically conductive layer 555 (e.g., a suitable metal or metal silicide). For purposes of illustration, the example device 500 is shown as an n-p-n transistor having n-type source and drain wells, and a p-type channel well. However, it will be appreciated that methods disclosed herein are equally applicable to fabrication of p-n-p transistors with a p-type channel by substituting n-type doping for p-type doping and vice versa as appropriate.

FIG. 5A depicts an example doping procedure useful in the fabrication of the structures shown forming the source well 530 in FIG. 5B. As shown, a layer of photoresist 559 is patterned over the structure including the drain well 535 (not shown), exposing the source well 530. An angled dopant implantation 560 may be used to form the deep p-doped body well 531. A second dopant implantation 565 may be used to form the shallower, more highly doped p-well 532. Additional deep implant may be beneficial in further reduce parasitic path resistance. After the resist 559 is removed, similar processes to those described above in connection to FIGS. 3A-3F may be used to complete the fabrication of the device 500. The extension gate 556 and thick dielectric 546 may replace trench for more compact device shown in FIG. 5C. Additional mask may be patterned to block p-well 532 implant in drain area 535.

One or more of the components, steps, features, and/or functions illustrated in FIGS. 1-5 may be rearranged and/or combined into a single component, step, feature, or function or embodied in several components, steps, or functions. Additional elements, components, steps, and/or functions may also be added without departing from novel features disclosed herein. The apparatus, devices, and/or components illustrated in FIGS. 1-5 may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

Although embodiments have been described herein with respect to particular configurations and sequences of operations, it should be understood that alternative embodiments may add, omit, or change elements, operations and the like. Accordingly, the embodiments disclosed herein are meant to be examples and not limitations.

What is claimed is:

1. A method for fabricating a low loss power device comprising the steps of:
    providing a substrate having a semiconductive region extending below a top surface of the substrate, the semiconductive region having first and second ends opposing one another along a direction parallel to the top surface of the substrate;
    forming a first dielectric layer above the semiconductive region;
    disposing a first gate electrode over the semiconductive region between the first and second ends;
    forming a third dielectric layer over the first gate electrode and the first dielectric layer;
    patterning the first and third dielectric layers to expose a first region of the top surface of the substrate;
    forming a second dielectric layer having a second thickness on the first region of the top surface of the substrate adjacent to the first dielectric layer below the first gate electrode and near the first end; and
    disposing a second gate electrode over the second dielectric layer.

2. The method according to claim 1, further comprising a step of:
    applying a first dopant to form a first doped volume within a first volume of the substrate corresponding to the first region, the first doped volume having a width determined at least in part by a width of the first region.

3. The method according to claim 2, further comprising the steps of:
    forming a first spacer adjacent to the second gate electrode; and
    applying a second dopant to form a second doped volume within the first doped volume of the substrate, the second doped volume having a width determined by at least a width of the first region, a position of the second gate electrode, and a width of the first spacer;
    wherein the second doped volume has a majority carrier type opposite to a majority carrier type of the first doped volume.

4. The method according to claim 1, wherein the second gate electrode is formed by the steps of:
    forming an electrically-conductive layer above the first gate electrode and the first region; and
    patterning the electrically-conductive layer by an anisotropic reactive ion etching (RIE) process that leaves behind a portion of the electrically-conductive layer on the second dielectric layer to form the second gate electrode, the second gate electrode having vertical sidewalls that are substantially perpendicular to the top surface of the substrate.

5. The method according to claim 4, wherein the electrically-conductive layer is patterned after forming above the first gate electrode and above the first region without forming any layer that acts as a mask defining dimensions of the second gate electrode; and a width of the second gate electrode is defined by an as-formed thickness of the electrically-conductive layer.

6. The method according to claim 4, wherein patterning the electrically conductive layer comprises the steps of:
    forming a protective dielectric material layer above the electrically-conductive layer with a protective layer thickness; and
    etching the protective dielectric material layer using the anisotropic RIE process;
    wherein the anisotropic RIE process preferentially etches the protective dielectric layer and the electrically-conductive layer along a direction perpendicular to the top surface of the substrate;
    wherein the anisotropic RIE process removes the protective dielectric layer with a greater etching rate than an etching rate for the electrically-conductive layer;
    wherein the protective layer thickness and the anisotropic RIE process are jointly configured such that residual protective dielectric material adheres to a vertical sidewall of the second gate electrode farthest from the first gate electrode that faces the first gate electrode; and
    wherein the protective layer thickness and the anisotropic RIE process are jointly configured such that residual protective dielectric material adheres to a vertical sidewall of the third gate electrode farthest from the first gate electrode that faces the first gate electrode.

* * * * *